United States Patent

Bradl et al.

[11] Patent Number: 6,086,269
[45] Date of Patent: Jul. 11, 2000

[54] METHOD AND APPARATUS FOR APPLYING A SUBSTANCE TO A SURFACE

[75] Inventors: Stephan Bradl; Elke Hietschold, both of Dresden, Germany

[73] Assignee: Siemens Aktiengesellschaft, Munich, Germany

[21] Appl. No.: 09/073,177

[22] Filed: May 5, 1998

[30] Foreign Application Priority Data

May 5, 1997 [DE] Germany .................. 197 18 983

[51] Int. Cl.⁷ .................. G03D 5/04; B08B 3/02
[52] U.S. Cl. .................. 396/611; 396/627; 134/151; 134/902; 118/313; 239/601
[58] Field of Search .................. 396/611, 626, 396/627; 134/151, 153, 902; 118/313, 321; 239/601

[56] References Cited

U.S. PATENT DOCUMENTS

| | | | |
|---|---|---|---|
| 3,059,560 | 10/1962 | Gutzmer | 396/627 |
| 4,564,280 | 1/1986 | Fukuda | 396/627 |
| 5,374,312 | 12/1994 | Hasebe et al. | 118/321 |
| 5,524,654 | 6/1996 | Nakano | 134/902 |
| 5,625,433 | 4/1997 | Inada et al. | 396/627 |
| 5,772,764 | 6/1998 | Akimoto | 118/319 |

OTHER PUBLICATIONS

Publication in DE Magazine, Oberfläche + JOT 1987, Magazine 9, p. 52 "Neue Düse gegen Verschmutzung" [New Jet Against Contamination].

*Primary Examiner*—Alan A. Mathews
*Attorney, Agent, or Firm*—Herbert L. Lerner; Laurence A. Greenberg; Werner H. Stemer

[57] ABSTRACT

A method and an apparatus apply a substance, especially a developer, to a surface through jets. Each jet carries the substance to be applied to a predetermined portion of the surface, and each jet essentially applies a predetermined quantity of substance per unit of surface area, wherein at least one jet applies a maximum quantity of substance per unit of surface area to the surface. The quantity of substance per unit of surface area applied by each jet is selected in such a way that it is greater than 1% of the maximum quantity of substance per unit of surface area.

15 Claims, 4 Drawing Sheets

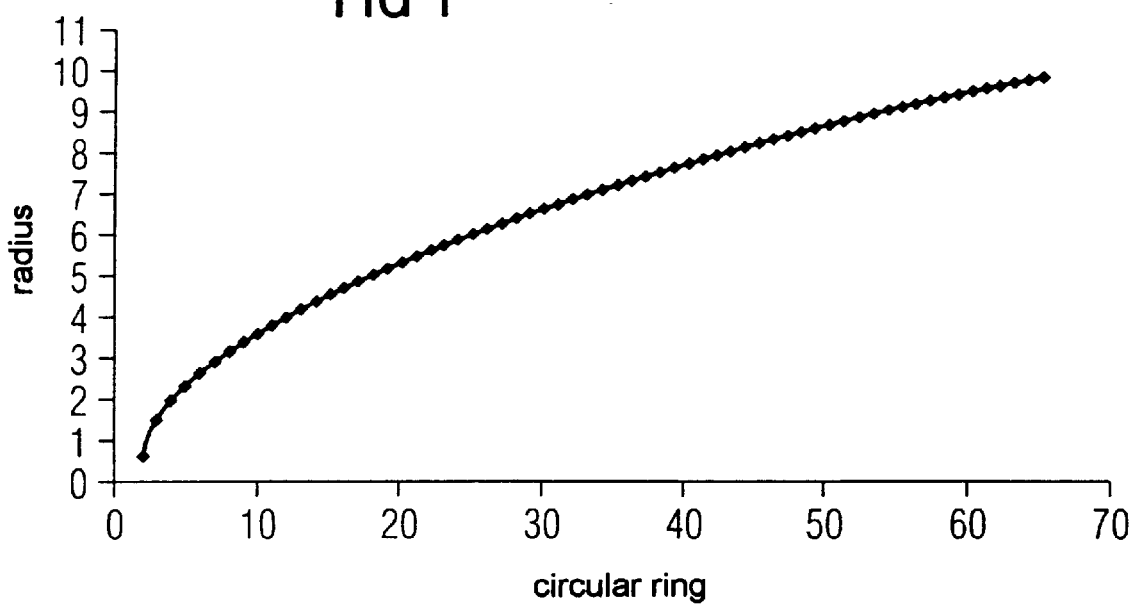
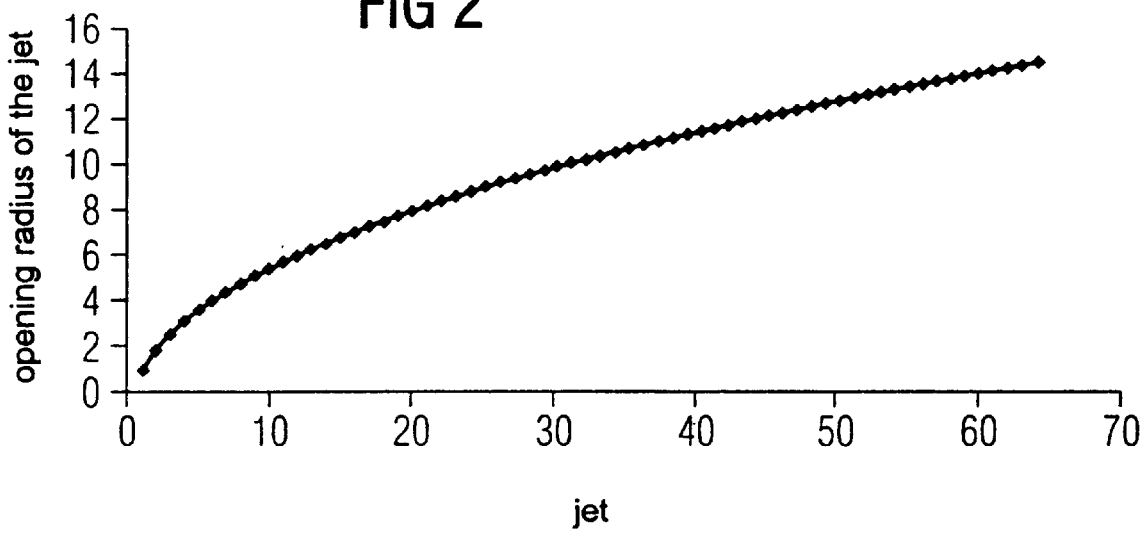

METHOD AND APPARATUS FOR APPLYING A SUBSTANCE TO A SURFACE

BACKGROUND OF THE INVENTION

Field of the Invention

The present invention relates to a method for applying a substance, in particular a developer, to a surface. The present invention also relates to an apparatus for performing the method of the invention.

In the production of integrated semiconductor products, process steps often arise in which a substance must be applied to the surface of a semiconductor wafer. Particularly in the structuring of the wafer surface by a phototechnique, a developer fluid must be applied to an exposed photoresist, in order for a latent image created by illumination to be developed in the photoresist.

However, in the wet chemical developer process of photoresists, the nonhomogeneity with which the developer is applied causes fluctuations in the widths of resist structures, and they are transferred directly to the substrate to be etched. That causes a fluctuation in the structural dimensions within a chip and from one chip to another, and those fluctuations can, for instance, lead to different electrical parameters of the integrated circuits, or even the failure of an integrated circuit.

Since resist thickness fluctuations can lead to differences in electrical parameters of the integrated circuits as well as to the failure of an integrated circuit as already noted, certain resist and etching thickness limits are prescribed, so that the integrated circuit can be produced in functional, reliable form. In order to adhere to those limits and minimize rework rates in lithography, it is therefore necessary to optimize the developer process in such a way that resist thickness fluctuations caused by the developer application can be reduced.

SUMMARY OF THE INVENTION

It is accordingly an object of the invention to provide a method and an apparatus for applying a substance, especially a developer, to a surface, which overcome the hereinafore-mentioned disadvantages of the heretofore-known methods and apparatuses of this general type and which assure adequately uniform distribution of the substance to be applied to the surface.

With the foregoing and other objects in view there is provided, in accordance with the invention, a method for applying a substance, especially a developer, to a surface, which comprises applying a substance to be applied to a surface through jets; each jet carrying the substance to be applied to a predetermined portion of the surface; each jet essentially applying a predetermined quantity of substance per unit of surface area (substance density); at least one jet applying a maximum quantity of substance per unit of surface area (substance density) to the surface; and selecting a quantity of substance per unit of surface area (substance density) applied by each jet to be greater than 1% of the maximum quantity of substance per unit of surface area (substance density).

With the objects of the invention in view, there is also provided a method for applying a substance, especially a developer, to a surface, which comprises applying a substance to be applied to a surface through at least one jet; each portion of the at least one jet carrying the substance to be applied to a predetermined portion of the surface; each portion of the at least one jet essentially applying a predetermined quantity of substance per unit of surface area (substance density); at least a portion of the at least one jet applying a maximum quantity of substance per unit of surface area (substance density) to the surface; and selecting a quantity of substance per unit of surface area (substance density) applied by a portion of each jet to be greater than 1% of the maximum quantity of substance per unit of surface area (substance density).

In this way, it is assured, for instance in a developer step, that not too much developer will be applied in the middle of the wafer, and that an adequately uniform distribution of the developer on the surface will occur.

In accordance with another mode of the invention, the substance density (quantity of substance per unit of surface area) applied by each jet is selected in such a way that it is greater than 10%, and preferably greater than 50%, of the maximum substance density (quantity of substance per unit of surface area). In accordance with a further mode of the invention, the jets are moved substantially rectilinearly and uniformly relative to the surface.

In accordance with an added mode of the invention, at least some of the jets are moved relative to the surface, in each case along at least a portion of a circle.

With the objects of the invention in view, there is additionally provided an apparatus for applying a substance to a surface, comprising a housing; at least one feeder associated with the housing for receiving a substance to be applied to a surface having a middle and an edge; and jets for carrying the substance to the surface, at least one of the jets disposed adjacent the middle of the surface, at least one of the jets disposed adjacent the edge of the surface, the jets having jet openings, and the jet opening of the at least one jet adjacent the middle of the surface being smaller than the jet opening of the at least one jet adjacent the edge of the surface. It may also be stated that the area of the jet that is disposed adjacent the middle of the surface is smaller than the area of the jet that is disposed adjacent the edge of the surface.

With the objects of the invention in view, there is further provided an apparatus for applying a substance to a surface, comprising a housing; at least one feeder associated with the housing for receiving a substance to be applied to a surface having a middle and an edge; and jets for carrying the substance to the surface, at least two of the jets disposed adjacent the middle of the surface, at least two of the jets disposed adjacent the edge of the surface, two of the jets adjacent the middle of the surface separated by a given radial spacing, and two of the jets adjacent the edge of the surface separated by a radial spacing less than the given radial spacing.

In accordance with another feature of the invention, each jet has a predetermined radial spacing from the middle of the surface.

In accordance with a further feature of the invention, for at least some of the jets, the surface areas $S_i$ of the jet openings vary in accordance with the formula:

$$S_{i+n}/S_i = ((r_{i+n+1}^2 - r_{i+n}^2)/(r_{i+1}^2 - r_i^2)).$$

In accordance with an added feature of the invention, for at least some of the jets, the equation:

$$2r_{i+1}^2 - r_i^2 = r_{i+2}^2$$

applies.

With the objects of the invention in view, there is also provided an apparatus for applying a substance to a surface, comprising a housing; at least one feeder associated with the housing for receiving a substance to be applied to a surface having an edge; and at least one jet for carrying the substance to the surface, the at least one jet having a jet opening area increasing toward the edge of the surface.

With the objects of the invention in view, there is additionally provided an apparatus for applying a substance to a surface, comprising a jet array having at least one jet through which a substance to be applied to a surface is carried to the surface; and a guide device and a drive device for moving the jet array and the surface rectilinearly and preferably uniformly relative to one another.

In accordance with a concomitant feature of the invention, the jet array moves relative to the surface or the surface moves relative to the jet array.

Other features which are considered as characteristic for the invention are set forth in the appended claims.

Although the invention is illustrated and described herein as embodied in a method and an apparatus for applying a substance to a surface, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a graph for a virtually optimal jet array, with each of the jets having the same jet area;

FIG. 2 is a graph for a virtually optimal selection of jet radii as a function of radial positions of each jet above a surface;

DESCRIPTION OF THE PREFERRED EMBODIMENTS

Figure 7:
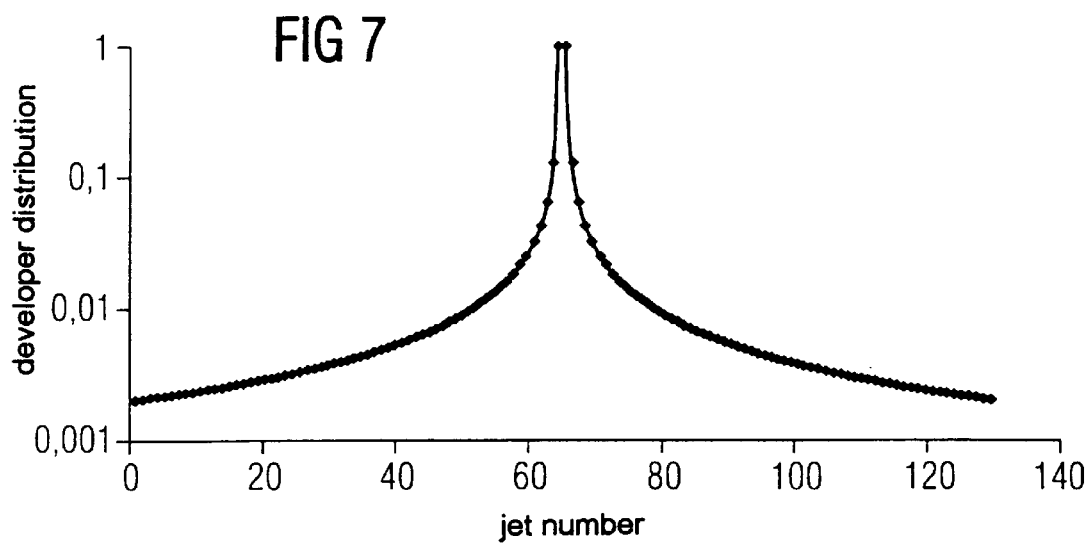
FIG. 7 is a graph of a distribution of developer when a 128-jet $E^2$ nozzle is used in accordance with a conventional method.
Figure 8:
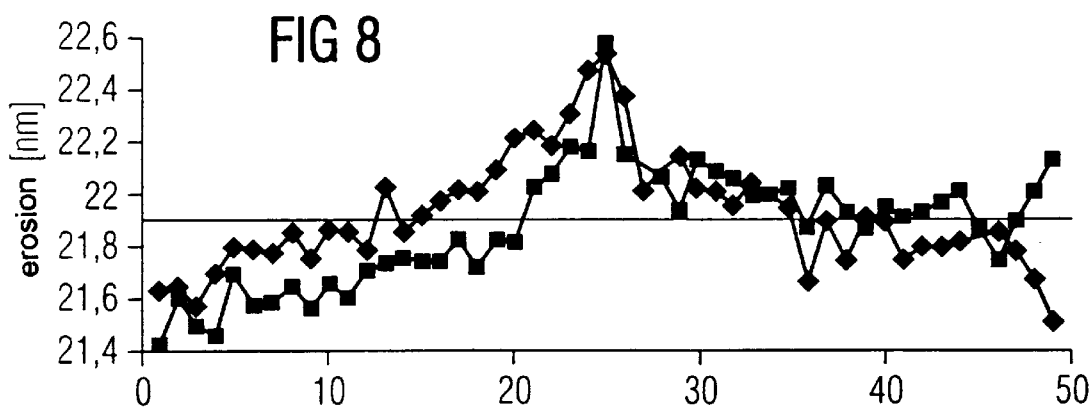
FIG. 8 is a graph for an absolute resist dark erosion in a conventional method.
Figure 9:
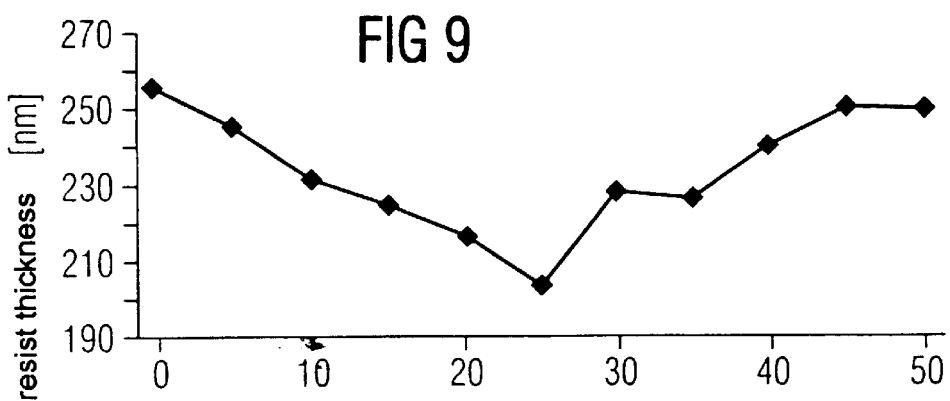
FIG. 9 is a graph for resist thickness fluctuations in a conventional method.

Referring now to the figures of the drawings in detail and first, particularly, to FIGS. 7, 8 and 9 thereof, it is noted that a wet chemical developing process of photoresists after exposure to light is carried out, for instance, by producing a "developer puddle", using an $E^2$ nozzle made by the firm TEL (Tokyo Electron Ltd.).

To that end, the $E^2$ nozzle is moved to the middle of a wafer. During a subsequent application of developer, the wafer rotates 180°, so that the entire wafer surface is wetted with developer.

Since the wafer is rotating while the same quantity of developer emerges from all of the jets of the $E^2$ nozzle because of an equal jet diameter, a higher concentration per unit of surface area (quantity of developer per unit of surface area) occurs in the middle of the wafer than on the edge. A resultant developer density distribution over the wafer is graphically represented in FIG. 7.

It can be seen therefrom that depending on the distance from the middle of the wafer, the developer has a tendency to be consumed less toward the middle of the wafer and to act more intensively.

The effects of this nonhomogeneous developer distribution can be proven, for instance by the following measurements.

a. "absolute dark erosion of resist"

In that case the term "dark erosion" stands for the difference in the resist thickness of a wafer unexposed to light, without a developing step, and the resist thickness of an unexposed wafer with a developing step.

That measurement involves the dark erosion of the photoresist "UVIIHS 0.6" after the developing step with an $E^2$ nozzle and the developer "TMAH 238 WA". A photoresist is applied to a 200 mm silicon wafer. After that, an $E^2$ nozzle is moved to the middle of the wafer, and developer is applied to the wafer from the 104 spray jets of the $E^2$ nozzle. During that application, the wafer rotates 180°. The developer which is applied spreads over the wafer in such a way that a "developer puddle" occurs. After a certain development time, the puddle is rinsed off with $H_2O$.

FIG. 8 shows a resultant dark erosion for two wafers. The greater resist erosion toward the middle of the wafer is clearly apparent. 50 measurement points were disposed diagonally over the wafer from one edge to the other.

b. fluctuation in resist thickness crosswise across the wafer

In that measurement, the width of resist structures is measured and the same exposure dose and the same focus on the silicon substrate is set over the entire surface of the wafer.

200 mm silicon wafers were painted with the photoresist "UVIIHS 0.61" in a thickness of 640 nm and exposed to light using a resolution reticle (template). 250 nm strips were measured. TMAH 238 WA was used as the developer. As can be seen from FIG. 9, the dimensional fluctuation over the wafer totaled 57.8 nm. Once again, 50 measurement points were disposed diagonally across the wafer from one edge to the other.

The geometrical considerations on which the present invention is based will now be described in further detail. It is assumed in this case that the surface to be wetted is constructed in such a way that it is possible to speak of a center point of the surface. A semiconductor wafer is one example of such a surface. In order to wet such a surface, the jets are typically guided along circular orbits about the center point over the surface. In other words, during the wetting of the surface, each jet has a fixed radial spacing $R_i$ from the center point of the surface. For the following discussion, the radial spacing of the jet that is closest to the center point will be assumed to be equal to zero, even though the jet is not directly centered above the center point. It should also be noted that if two or more jets have substantially the same radial spacing from the center point of the surface, then those jets can be considered as if they were one single jet with a correspondingly enlarged jet opening. In estimating the surface area wetted by one jet, it is assumed that one jet wets approximately a portion of a circular ring that is located between the radius $r_i$ of the jet itself and $r_{i+1}$ of the radially next jet.

On the basis of these circular rings, the area ratio $\sigma_{ni}$ of the circular rings $A_{i+n}$ to $A_i$ is as follows:

$$\sigma_{ni} = A_{i+n}/A_i = (r_{i+n+1}^2 - r_{i+n}^2)/(r_{i+1}^2 - r_i^2)$$

where $A_i$=the area of the circular ring i: $(r_{i+1}^2 - r_i^2)*\pi$ and $A_{i+n}$=the area of the circular ring i+n: $(r_{i+n+1}^2 - r_{i+n}^2)*\pi$ It can be seen from this that a jet in the vicinity of the edge of the surface must cover a markedly larger area than a jet located near the center of the surface. Accordingly, on the assumption of equal jet openings, a markedly lesser quantity of substance per unit of surface area is established at the edge of the surface.

In order to counteract this effect, it is provided according to one embodiment of the present invention that the spacings of the jets in the vicinity of the center point of the surface are selected to be greater than the spacings of the jets in the vicinity of the edge of the surface. In other words, this embodiment of the present invention has at least one reference point which is located, during operation of the apparatus, in the vicinity of the center point of the surface and preferably directly above the center point of the surface. Two jets of the apparatus which are located adjacent this reference point have a greater radial spacing, in this embodiment, than two jets that are located at a distance from this reference point.

The spacings of the individual jets are preferably radially distributed in such a way that, on the assumption of a constant flow of substance, each jet sweeps a portion of equal area of the surface. This assures a virtually uniform application of the substance.

In the case of this optimal radial distribution of the jets, the following equation therefore applies:

$$2r_{i+1}^2 - r_i^2 = r_{i+2}^2.$$

This radial distribution of the jets is shown in FIG. 1. For most uses, however, it is adequate if only some of the jets, preferably those in the vicinity of the center point of the surface (in the vicinity of the reference point), are disposed in accordance with this equation.

In a further embodiment of the present invention, assuming equal spacings of the individual jets, the areas of the jet opening are adapted in such a way that the area of one jet which is located adjacent the middle of the surface is less than the area of a jet located adjacent the edge of the surface. In other words, this embodiment of the present invention likewise has a reference point which during operation of the apparatus is located in the vicinity of the center point of the surface, and preferably directly above the center point of the surface. A jet of the apparatus that is located adjacent this reference point in this embodiment has a lesser jet opening than a jet located at a distance from this reference point.

The jet openings are preferably selected in such a way that a flow of developer that is directly proportional to the applicable circular-annular area is produced.

In the case of circular jet openings, the following equation then applies for the radius $r_{i,Nozzle}$ of one jet:

$$r_{i+n,Nozzle}^2/r_{i,Nozzle}^2 = ((r_{i+n+1}^2 - r_{i+n}^2)/(r_{i+1}^2 - r_i^2)).$$

This distribution of the radii of the jets is shown in FIG. 2. For most uses, however, it is adequate if only some of the jets, preferably those in the vicinity of the center of the surface, have a radius that is selected in accordance with this equation. Naturally, a simultaneous adaptation of the jet openings and of the radial spacings of the jets is also possible.

Figure 3:
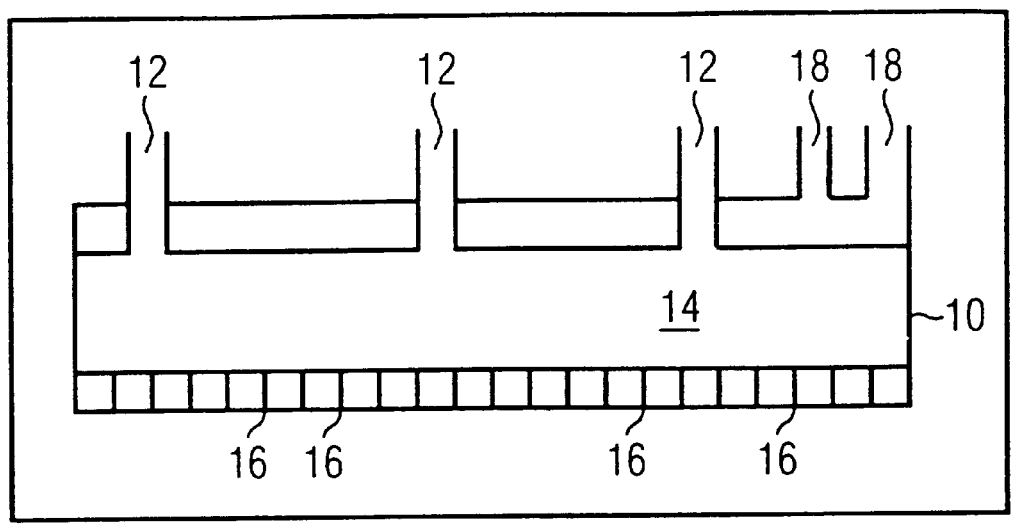
FIG. 3 is a diagrammatic, elevational view of an apparatus according to the invention for applying a substance to a surface.

FIG. 3 shows such an apparatus for applying a substance to a surface. Feeders 12 are provided in a housing 10, and a substance 14 to be applied is carried through them to the apparatus. The substance 14 to be applied is carried to a non-illustrated surface through jets 16 disposed on the side of the housing opposite the feeders. Center points of the jets 16 are spaced apart equally from one another. In order to assure the most homogeneous possible application of the substance, the radii of the jet openings are selected in accordance with the above equation. The middle of the apparatus (reference point) is located directly above the center point of the surface to be covered, during operation of the apparatus. Cooling feeders 18 are also provided, on the side of the housing on which feeders 12 are provided.

FIG. 3 shows a substantially linear array of jets 16. However, a star-shaped configuration of jets can also be selected, for instance two linear configurations of jets that intersect at 900. It should be noted that if two or more jets have substantially the same radial spacing from the center point of the surface, or from a reference point, then these jets can be considered to be a single jet with a correspondingly enlarged jet opening.

Figure 4:
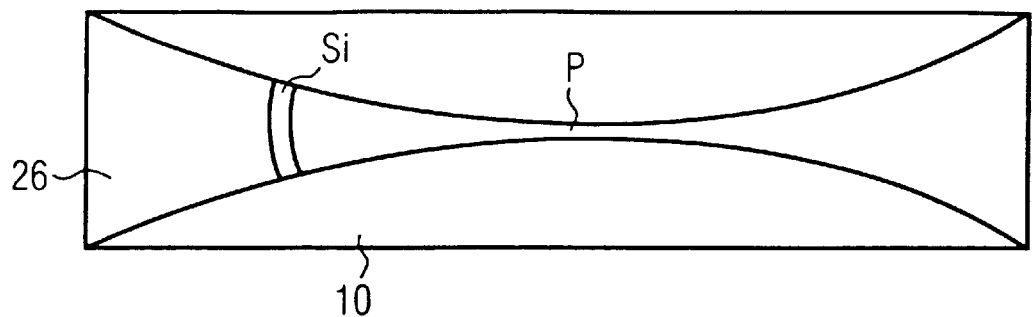
FIG. 4 is a bottom-plan view of a further embodiment of the present invention.

Instead of many jets, a few suitably shaped jets may be provided. FIG. 4 shows a plan view on the underside of a further embodiment of the present invention. In this case the multiplicity of jets have been replaced by a single jet 26. The jet 26 is shaped in such a way that the area of the jet 26 increases toward the edge of the surface. In particular, the jet 26 is shaped in such a way that area portions $S_i$ of the jet 26, which have a radial spacing $r_i$ from the middle of the surface or from a reference point P, vary in accordance with the formula $$S_{i+n}/S_i((r_{i+n+1}^2 - r_{i+n}^2)/(r_{i+1}^2 - r_i^2)).$$

The remaining structure of the embodiment shown in FIG. 4 is equivalent to the apparatus shown in FIG. 3.

Figure 5:
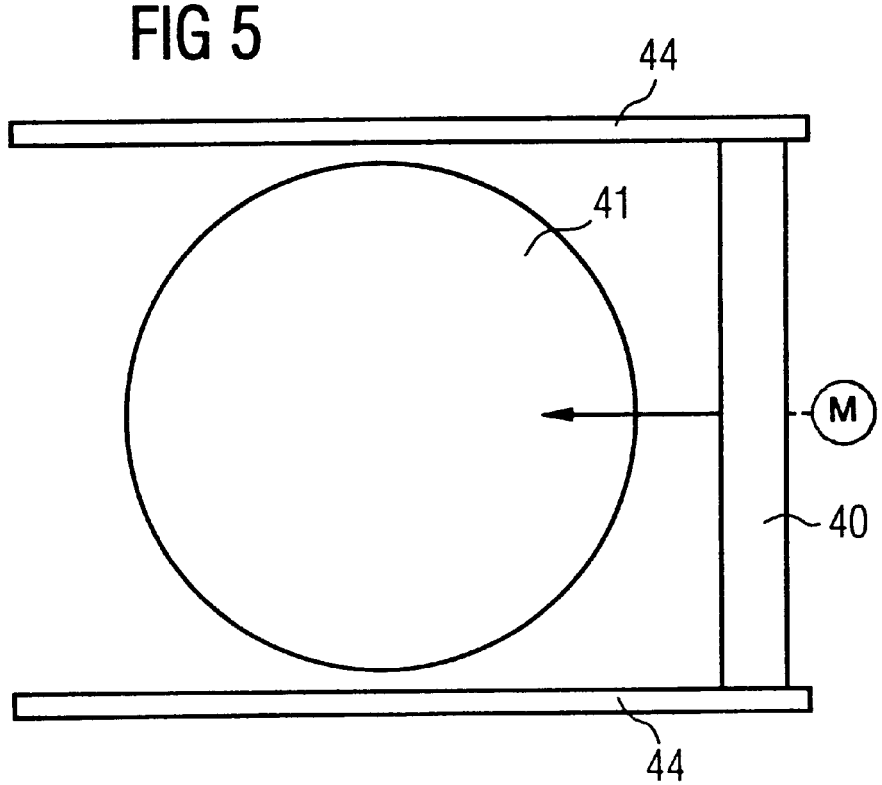
FIG. 5 is a plan view of a further embodiment of the invention.

In a further embodiment of an apparatus for carrying out the method of the invention, an adequately homogeneous application of the substance is assured by providing that the jets are moved relative to the surface, substantially rectilinearly and preferably uniformly. As can be seen from FIG. 5, to that end a linear jet array 40, with jets that each have equal jet openings and equal spacing from one another, is moved rectilinearly and substantially uniformly over the surface of a semiconductor wafer 41. The motion of the jet array 40 is effected by a guide device 44 and a drive device, such as an electric motor M.

Figure 6:
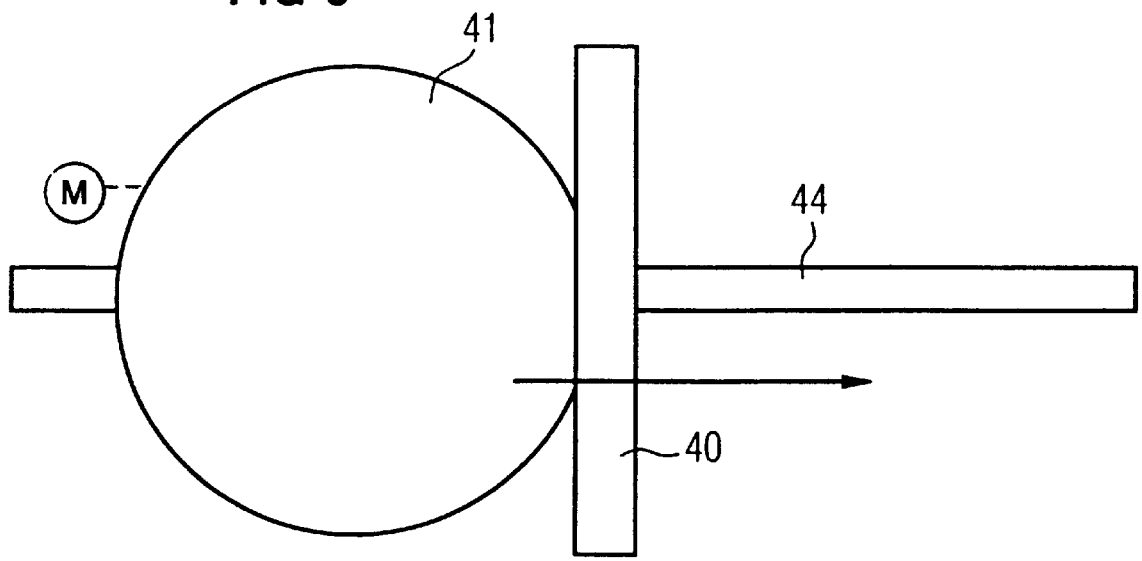
FIG. 6 is a plan view of a further apparatus according to the invention for applying a substance to a surface.

FIG. 6 shows a further embodiment of the present invention. In this case, the wafer surface 41 is moved relative to the jet array 40 along the guide device 44. The surface is driven by an electric motor M.

What is claimed is:

1. An apparatus for applying a substance to a surface, comprising:

a housing;

at least one feeder associated with said housing for receiving a substance to be applied to a surface having a middle and an edge; and jets for carrying the substance to the surface, at least one of said jets disposed adjacent the middle of the surface, at least one of said jets disposed adjacent the edge of the surface, each of said lets having a predetermined radial spacing $r_i$ from the middle of the surface, said jets having jet openings, said jet opening of said at least one jet adjacent the middle of the surface being smaller than said jet opening of said at least one jet adjacent the edge of the surface, and at least some of said lets having jet opening surface areas $S_i$ varying in accordance with the formula:

$$S_{i+n}/S_i=((r_{i+n+1}^2-r_{i+n}^2)/(r_{i+1}^2-r_i^2)).$$

2. The apparatus according to claim 1, wherein the equation:

$$2r_{i+1}^2-r_i^2=r_{i+2}^2$$

applies for at least some of said jets.

3. The apparatus according to claim 1, wherein said lets are a jet array through which the substance to be applied to the surface is carried to the surface, and including a guide device and a drive device for moving said jet array and the surface rectilinearly relative to one another.

4. The apparatus according to claim 3, wherein said guide device and said drive device move said jet array and the surface uniformly relative to one another.

5. The apparatus according to claim 3, wherein said guide device and said drive device move said jet array relative to the surface.

6. The apparatus according to claim 3, wherein said guide device and said drive device move the surface relative to said jet array.

7. An apparatus for applying a substance to a surface, comprising:
   a housing;
   at least one feeder associated with said housing for receiving a substance to be applied to a surface having a middle and an edge; and
   jets for carrying the substance to the surface, at least two of said jets disposed adjacent the middle of the surface, at least two of said jets disposed adjacent the edge of the surface, each of said lets having a predetermined radial spacing $r_i$ from the middle of the surface, two of said jets adjacent the middle of the surface separated by a given radial spacing, two of said jets adjacent the edge of the surface separated by a radial spacing less than said given radial spacing and applying the equation:

$$2r_{i+1}^2-r_i^2=r_{i+2}^2$$

for at least some of said jets.

8. The apparatus according to claim 7, wherein at least some of said jets have jet opening surface areas $S_i$ varying in accordance with the formula:

$$S_{i+n}/S_i=((r_{i+n+1}^2-r_{i+n}^2)/(r_{i+1}^2-r_i^2)).$$

9. The apparatus according to claim 7, wherein said jets are a jet array through which the substance to be applied to the surface is carried to the surface, and including a guide device and a drive device for moving said jet array and the surface rectilinearly relative to one another.

10. An apparatus for applying a substance to a surface, comprising:
    a housing;
    at least one feeder associated with said housing for receiving a substance to be applied to a surface having an edge; and at least one jet for carrying the substance to the surface, said at least one jet having a jet opening with a cross-section, a center, and at least one edge, said cross-section of said let opening increasing from said center of said let opening toward said at least one edge of said jet opening.

11. The apparatus according to claim 10, wherein said at least one jet has area portions $S_i$ with a radial spacing $R_i$ from middle of the surface varying in accordance with the formula:

$$S_{i+n}/S_i=((r_{i+n+1}^2-r_{i+n}^2)/(r_{i+1}^2-r_i^2)).$$

12. The apparatus according to claim 10, wherein said at least one jet is a jet array through which the substance to be applied to the surface is carried to the surface, and including a guide device and a drive device for moving said jet array and the surface rectilinearly relative to one another.

13. A method for applying a substance to a surface, which comprises:
    providing a housing and a feeder associated with the housing for receiving a substance to be applied to a surface having a middle and an edge;
    providing a plurality of jets each having a jet opening and associated with the feeder for receiving the substance to be applied to the surface;
    positioning at least one of the jets in the feeder adjacent the middle of the surface and at least one of the jets adjacent the edge of the surface;
    positioning each of the jets in the feeder at a predetermined radial spacing $r_i$ from the middle of the surface;
    adjusting a jet opening of the at least one jet adjacent the middle of the surface to be smaller than the jet opening of the at least one jet adjacent the edge of the surface;
    varying at least some of the jets having jet opening surface areas $S_i$ in accordance with the formula:

$$S_{i+n}/S_i=((r_{i+n+1}^2-r_{i+n}^2)/(r_{i+1}^2-r_i^2));$$

applying the substance to the surface through the plurality of jets;
    each of the plurality of jets carrying the substance to be applied to a predetermined portion of the surface; and
    each of the plurality of jets essentially applying a predetermined quantity of substance per unit of surface area.

14. A method for applying a substance to a surface, which comprises:
    providing a housing and a feeder associated with the housing for receiving a substance to be applied to a surface having a middle and an edge;
    providing a plurality of jets each having a jet opening and associated with the feeder for receiving the substance to be applied to the surface;
    positioning at least two of the jets in the feeder adjacent the middle of the surface and at least two of the jets adjacent the edge of the surface;
    positioning each of the jets in the feeder at a predetermined radial spacing $r_i$ from the middle of the surface;
    separating two of the jets adjacent the middle of the surface by a given radial spacing;
    separating two of the jets adjacent the edge of the surface by a radial spacing less than the given radial spacing; and
    applying the equation:

$$2r_{i+1}^2-r_i^2=r_{i+2}^2$$

for at least some of the jets;
    applying the substance to the surface through the plurality of jets;

each of the plurality of jets carrying the substance to be applied to a predetermined portion of the surface; and each of the plurality of jets essentially applying a predetermined quantity of substance per unit of surface area.

15. A method for applying a substance to a surface, which comprises:

provisioning a housing and a feeder associated with the housing for receiving a substance to be applied to a surface;

providing at least one jet associated with the feeder for receiving the substance to be applied to the surface, the at least one jet having a jet opening with a cross-section, a center, and at least one edge;

increasing the cross-section of the jet opening from the center of the jet opening toward the at least one edge of the jet opening;

applying the substance to the surface through the at least one jet;

the at least one jet carrying the substance to be applied to a predetermined portion of the surface; and the at least one jet essentially applying a predetermined quantity of substance per unit of surface area.

* * * * *